US012660536B2

(12) United States Patent
Zhang et al.

(10) Patent No.: US 12,660,536 B2
(45) Date of Patent: Jun. 16, 2026

(54) SYSTEMS AND METHODS FOR SEMICONDUCTOR ETCHING

(71) Applicant: Tokyo Electron Limited, Tokyo (JP)

(72) Inventors: Du Zhang, Albany, NY (US); Scott Lefevre, Albany, NY (US); Jeffrey Shearer, Albany, NY (US); Peter Biolsi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 494 days.

(21) Appl. No.: 18/322,502

(22) Filed: May 23, 2023

(65) Prior Publication Data

US 2024/0395557 A1 Nov. 28, 2024

(51) Int. Cl.
| | |
|---|---|
| *H10P 50/24* | (2026.01) |
| *H10P 50/28* | (2026.01) |
| *H10W 20/00* | (2026.01) |

(52) U.S. Cl.
CPC .......... *H10P 50/242* (2026.01); *H10P 50/287* (2026.01); *H10W 20/056* (2026.01); *H10W 20/076* (2026.01)

(58) Field of Classification Search
None
See application file for complete search history.

(56) References Cited

U.S. PATENT DOCUMENTS

| | | | | |
|---|---|---|---|---|
| 6,303,512 | B1 * | 10/2001 | Laermer ........... | H01L 21/30655 438/723 |
| 10,872,818 | B2 | 12/2020 | Chiang et al. | |

| | | | | |
|---|---|---|---|---|
| 2004/0097090 | A1 * | 5/2004 | Mimura ................ | H01L 21/308 257/E21.597 |
| 2007/0080136 | A1 * | 4/2007 | Takata .............. | H01L 21/76898 257/E21.597 |
| 2007/0197041 | A1 * | 8/2007 | Nakaya ............... | H01J 37/3266 257/E21.252 |
| 2008/0093338 | A1 * | 4/2008 | Okune .............. | H01J 37/32091 257/E21.314 |
| 2009/0184089 | A1 * | 7/2009 | Chebi ............... | H01J 37/32449 216/13 |
| 2012/0238098 | A1 * | 9/2012 | Uda .................. | H01L 21/76898 257/E21.232 |
| 2013/0052826 | A1 | 2/2013 | Nepomnishy et al. | |
| 2014/0227876 | A1 * | 8/2014 | Tohnoe .............. | H01L 21/3065 438/695 |
| 2020/0279757 | A1 * | 9/2020 | Kumakura .............. | C23C 16/52 |
| 2021/0082713 | A1 | 3/2021 | Katsunma et al. | |
| 2022/0068661 | A1 | 3/2022 | Shaw et al. | |

OTHER PUBLICATIONS

PCT and International Search Report issued in International Application No. PCT/US2024/018998 dated Mar. 8, 2024 (8 Pages).

* cited by examiner

*Primary Examiner* — Allan W. Olsen
(74) *Attorney, Agent, or Firm* — Foley & Lardner LLP

(57) ABSTRACT

A method is provided. The method includes etching a substrate to form a recess in the substrate through a plurality of stages. A first one of the plurality of stages forms an inhibitor layer lining an initial portion of the recess based on first etchant radicals. A second one of the plurality of stages exposes the initial portion of the recess based on ions. A third one of the plurality of stages extends the initial portion of the recess based on second etchant radicals.

20 Claims, 11 Drawing Sheets

SYSTEMS AND METHODS FOR SEMICONDUCTOR ETCHING

TECHNICAL FIELD

This disclosure relates to deep semiconductor etching. Semiconductor substrates such as wafers or dies can include various etching steps to form high aspect ratio recesses such as to receive vertical elements or form further layers in the deep recesses.

BACKGROUND

Fabrication of semiconductor devices relies on execution of various fabrication processes that are performed repeatedly in order to form desired semiconductor features on a substrate. In the recent years, scaling down semiconductor devices became more challenging as features sizes reached single digit nanometer range. Fabrication of recesses can include various processes which include anisotropic chemical reactants, and thus may cause scalloping or other non-verticality along a sidewall of a recess.

SUMMARY

In order to continue scaling down semiconductor devices, device structures can be designed to extend in their vertical direction. Some semiconductor devices can include deep etching such as deep reactive ion etching processes. Deep etching processes, such as STiGer and Bosch processes, can employ cyclic etching to alternate between isotropic etching and passivation processes, which may take advantage of relatively high etch rates of at least a portion of isotropic etchants. However, such processes can lead to surface roughness (e.g., scalloping) along a sidewall of the recesses formed thereby. A simultaneous application of an isotropic etchant with a passivation gas can reduce an isotropy of an etch, wherein a passivation layer is anisotropically removed by a process selective to the bottom of the recess relative to a sidewall (e.g., ion beam sputtering). However, process control may be difficult to achieve relative to a cyclic process. Further, such processes may expose a mask or other patterning layer to an etchant, such that the selected etchant should be highly selective to a material the recess is formed from (e.g., silicon, germanium, silicon-germanium, or the like). Although a mask layer may be formed thick enough to lose a portion of material, such a thick mask can increase an aspect ratio of formed recesses relative to an upper surface of the semiconductor device, and may be difficult to achieve. According to the systems and methods of the present disclosure, a process can employ a passivation gas along with the etchant at an etching stage of a cyclic process, and thereafter employ a passivation gas without the etchant at a passivation step. Such a cyclic process can maintain process control of a cyclic process and avoid scalloping associated with some cyclic processes.

The passivation gas employed during the etching step can be the same varied passivation gas employed during the passivation cycle. For example, the components, composition, or flow rate of the passivation gas can vary between the etching and passivation step. Systems and methods of the present disclosure can further vary a passivation gas to adjust a sidewall verticality, surface roughness, mask or sidewall selectivity, or a critical dimensionality (CD) of another portion of a recess such as an upper surface or lower surface of the various recesses of a semiconductor device.

One aspect of the present disclosure is directed to a method for etching a substrate to form a recess in the substrate. The method includes forming an inhibitor layer lining an initial portion of the recess based on first radicals, exposing the initial portion of the recess based on ions, and extending the initial portion of the recess with a mixture comprising the first radicals and the second radicals.

The second radicals may include sulfur hexafluoride ($SF_6$). The first radicals may include a combination of silicon tetrafluoride ($SiF_4$) and oxygen ($O_2$).

The second radicals may include sulfur hexafluoride ($SF_6$). The second radicals may include a combination of silicon tetrachloride ($SiCl_4$) and oxygen ($O_2$).

The second radicals may include sulfur hexafluoride ($SF_6$). The first radicals may include octafluorocyclobutane ($C_4F_8$).

Etching the substrate to form the recess may include repeating the forming, exposing, and extending steps (e.g., cyclically).

The first and second radicals may each have an isotropic characteristic, and the exposing step may have an anisotropic characteristic.

The exposing step may include removing a first portion of the inhibitor layer that overlays a bottom surface of the initial portion of the recess.

During the exposing step, a second portion of the inhibitor layer may extend along inner sidewalls of the initial portion of the recess substantially intact.

The recess may extend through the substrate. The method may include filling the recess with a conductive material.

Another aspect of the present disclosure is directed to a method. The method includes forming a patterned layer over a first portion of a substrate, with a second portion of the substrate exposed. The method includes forming an inhibitor layer along inner surfaces of a recess with the first radicals. The method includes etching the substrate along the second portion with second radicals to form the recess. The method includes breaking through the inhibitor layer along the second portion with ions. The method includes extending the recess with a mixture comprising the first radicals and second radicals.

The step of etching the substrate and the step of forming an inhibitor layer may be performed concurrently.

The second radicals may include sulfur hexafluoride ($SF_6$). The first radicals may include a combination of silicon tetrafluoride ($SiF_4$) and oxygen ($O_2$).

The second radicals may include sulfur hexafluoride ($SF_6$). The first radicals may include a combination of silicon tetrachloride ($SiCl_4$) and oxygen ($O_2$).

The second radicals may include sulfur hexafluoride ($SF_6$), and the first radicals may include octafluorocyclobutane ($C_4F_8$).

A ratio of the $SiF_4$ to the $O_2$ may exceed two standard cubic centimeters per minute (SCCM).

The method may include repeating the step of etching the substrate, the step of forming an inhibitor layer, the step of breaking through the inhibitor layer, and the step of extending the recess in such an order more than once.

Another aspect of the present disclosure is directed to a method. The method can include etching a semiconductor layer with a first isotropic reactant to form a recess therein. The method can include providing the first isotropic reactant to form an inhibitor layer lining inner surfaces of the recess. The method can include removing a portion of the inhibitor layer with an anisotropic reactant. The method can include providing a second isotropic reactant to extend the recess simultaneously to the provision of the first isotropic reactant.

The second isotropic reactant can include sulfur hexafluoride ($SF_6$). The first isotropic reactant can include a combination of silicon tetrafluoride ($SiF_4$) and oxygen ($O_2$).

The second isotropic reactant can include sulfur hexafluoride ($SF_6$). The first isotropic reactant can include a combination of silicon tetrachloride ($SiCl_4$) and oxygen ($O_2$).

The second isotropic reactant may include sulfur hexafluoride ($SF_6$). The first isotropic reactant may include octafluorocyclobutane ($C_4F_8$).

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
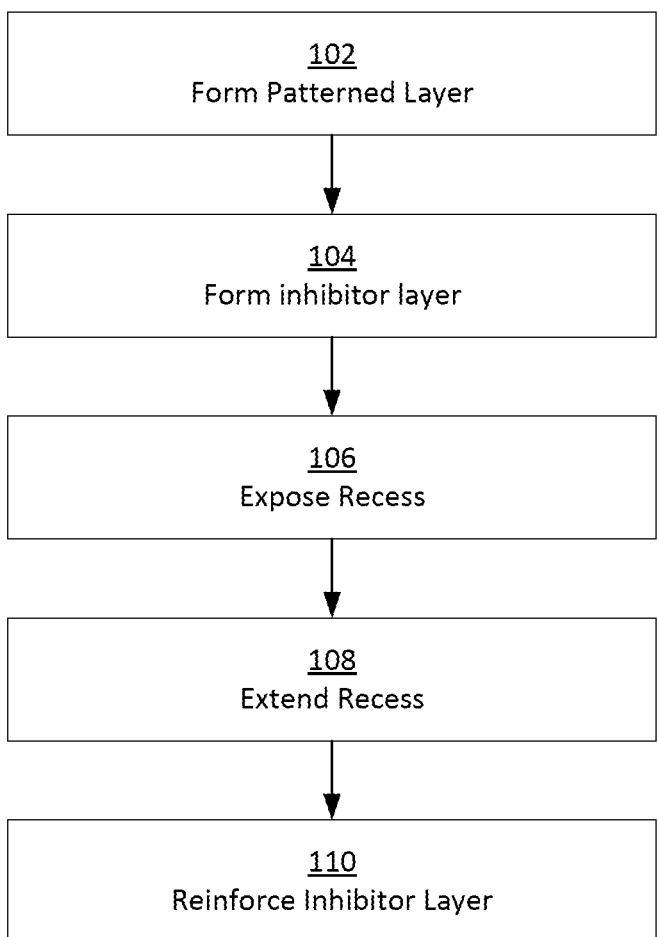
FIG. 1 illustrates a flow chart of an example method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry.

FIG. 1 illustrates a flowchart of an example method 100 for forming a semiconductor device. The semiconductor device can include a high aspect ratio recess into a semiconductor substrate. For example, each of the recesses may be laterally spaced over a surface of a semiconductor device, extending vertically into the device along a Z-height thereof, wherein the recesses can be employed to form device interconnects for a semiconductor device, deep trench capacitors, or various other features of the semiconductor device. Further, through performing at least some of operations of the method 100, an edge roughness or profile of the recesses can be modified or adjusted, according to a use of the recesses or a material of the device (e.g., a substrate or mask material). It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor device at various fabrication stages as shown in FIGS. 2 to 10, which will be discussed in further detail below. It should be understood that the semiconductor device, shown in FIGS. 2 to 10, may include a number of other devices such as inductors, fuses, capacitors, coils, etc., while remaining within the scope of the present disclosure.

In brief overview, the method 100 starts with operation 102 of forming a patterned layer (e.g., photoresist, hardmask, or other mask) over a substrate. The method 100 continues to operation 104 of forming an inhibitor layer over the semiconductor device. The method 100 proceeds to operation 106 of exposing at least a bottom surface of a recess, including a surface of the substrate therefor. The method 100 proceeds to operation 108 of extending at least the bottom surface of the recess into the substrate. The method 100 proceeds to operation 110 of reinforcing the inhibitor layer. One or more operations of the method 100 can be performed simultaneously. For example, operation 104 and 108 can be performed simultaneously to generate a substantially anisotropic opening with one or more isotropic etchants and passivation reactants.

Figure 2:
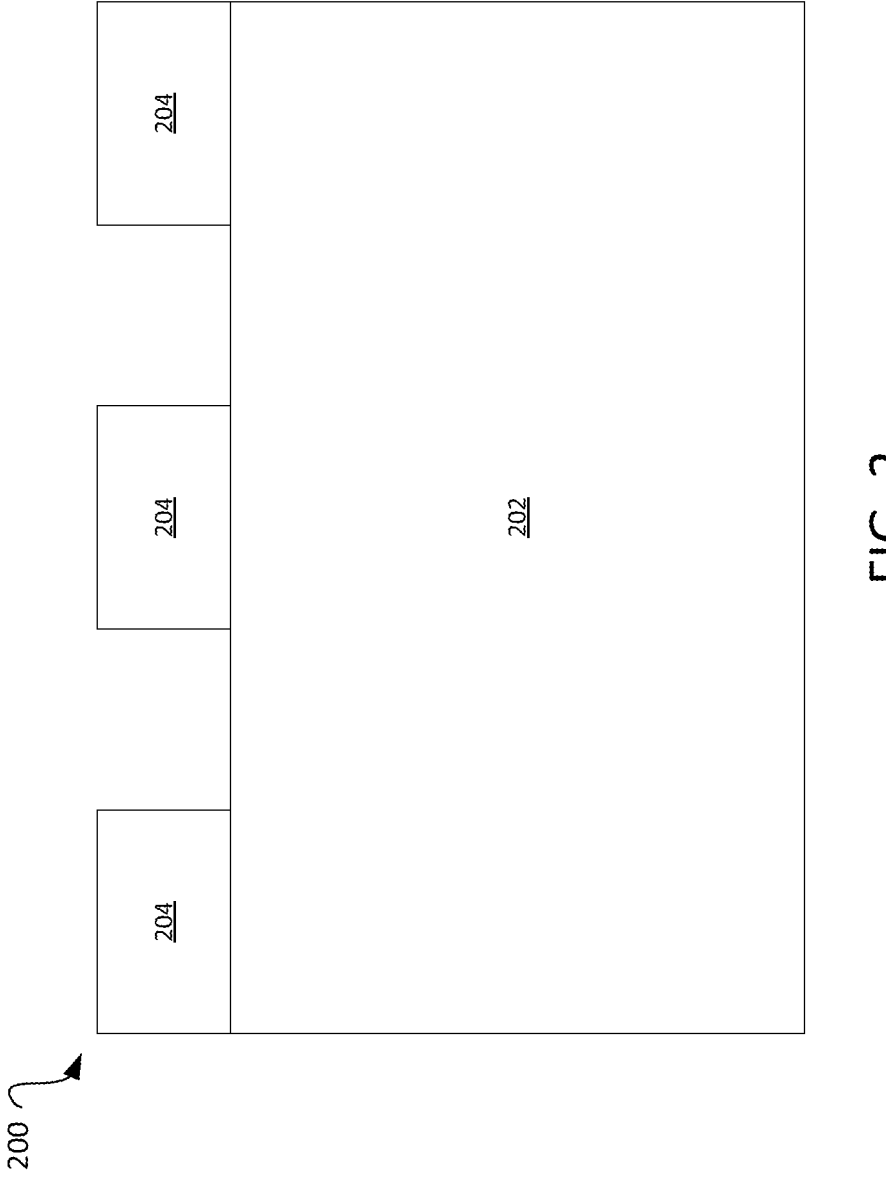
FIGS. 2, 3, 4, 5, 6, 7, 8, 9, and 10 illustrate cross-sectional views of a semiconductor device during various fabrication stages of the method of FIG. 1, in accordance with some embodiments.

Corresponding to operation 102 of FIG. 1, FIG. 2 is a cross-sectional view of the semiconductor device 200 in which a patterned layer 204 is formed over a substrate 202, in accordance with various embodiments.

The substrate 202 includes a semiconductor material substrate 202, for example, silicon. Alternatively, the substrate 202 may include other elementary semiconductor materials such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate 202 may have an epitaxial layer overlying a bulk semiconductor. Furthermore, the substrate 202 may include a semiconductor-on-insulator (SOI) structure. For example, the substrate

202 may include a buried oxide (BOX) layer formed by a process such as separation by implanted oxygen (SIMOX) or other suitable technique, such as wafer bonding and grinding.

As shown, over the substrate 202, a patterned layer 204 is formed. A patternable layer, such as a positive or negative photoresist mask (not depicted) with patterns can be formed over the substrate 202. The pattern may include a periodic pattern such that periodic openings are formed across the semiconductor device 200. The patternable layer may comprise the patterned layer 204, or another material (e.g., hardmask or other mask material) can be formed into openings of the patternable layer to form the depicted patterned layer 204. The substrate 202 and the patterned layer 204 may have different etching selectivity's. For example, the patterned layer 204 may be more resistive to an etchant than the material of the substrate 202 such that the patterned layer 204 may remain substantially intact during subsequent operations of the method 100.

Figure 3:
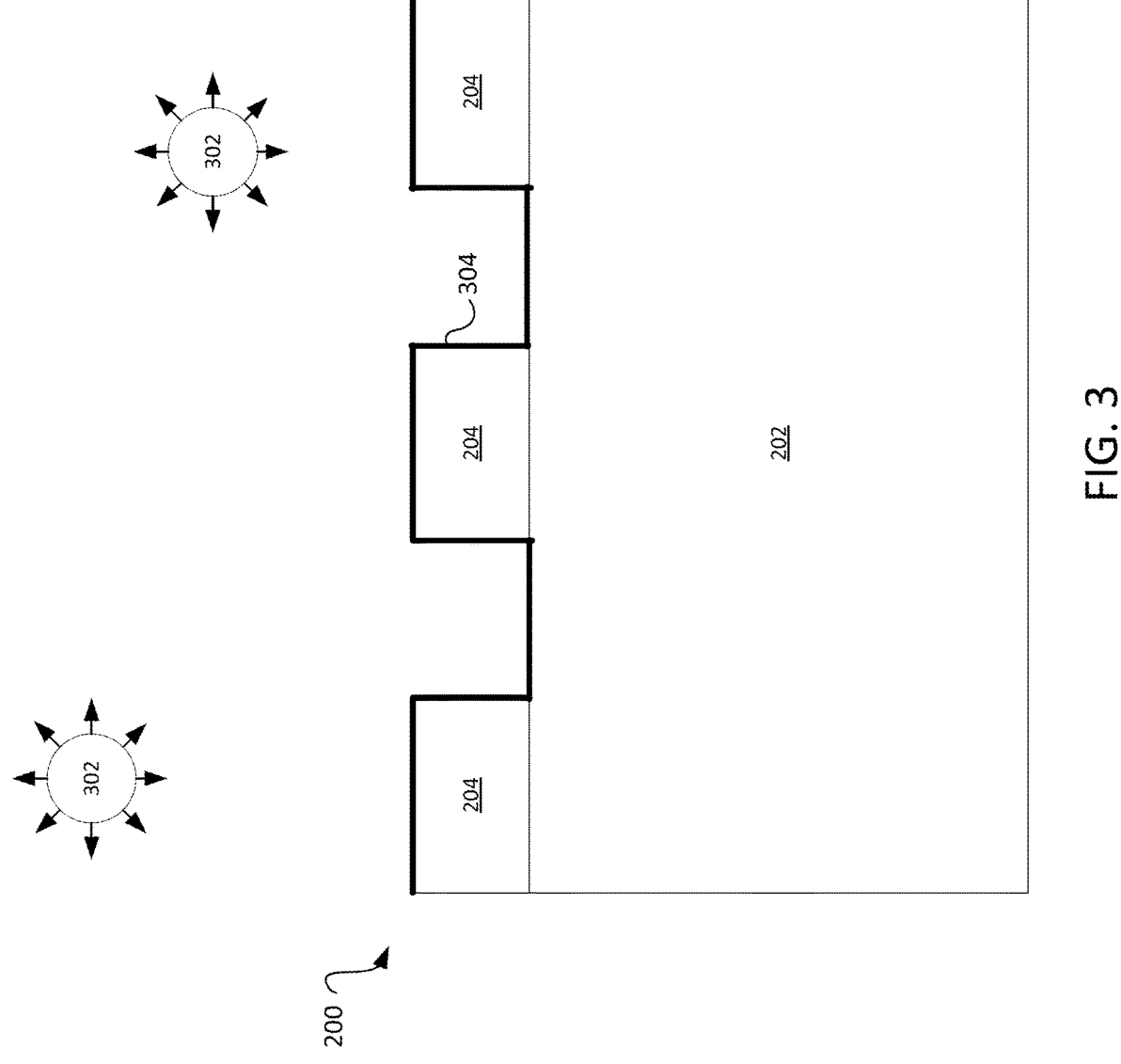

Corresponding to operation 104 of FIG. 1, FIG. 3 is a cross-sectional view of the semiconductor device 200 in which an inhibitor layer 304 is formed over a surface of the semiconductor device 200, such as over the patterned layer 204 of FIG. 2, and a recess portion thereof, in accordance with various embodiments.

A passivation radical 302 may passivate a surface of the semiconductor device 200. The passivation radical 302 may be electrically neutral such that the passivation radical 302 may not accelerate in the presence of electric fields (e.g., wherein the passivation is proximal to ions in an inductively coupled plasma, transformer coupled plasma, or the like). The passivation radical 302 may have an anisotropic characteristics, wherein the passivation radical 302 can form the inhibitor layer 304 along a surface of the semiconductor device 200, which may also be referred to as a passivation layer. For example, the passivation radical 302 can form in undercut portions of a recess or along substantially vertical sidewall of the recess at a same or similar thickness than along horizontal portions of the semiconductor device. Thus, a passivation material (e.g., the passivation radical 302) may be referred to as an isotropic reactant according to some embodiments of the present disclosure.

The passivation radical 302 can passivate the exposed surfaces by one or more mechanisms. For example, the passivation radical 302 can include oxidizers including oxygen ($O_2$) to oxidize a surface of the semiconductor device 200. Other passivation radicals 302 may form one or more polymers over a surface of the semiconductor device. The polymers may be resistive to another etchant (e.g., reactant etchant radical 502, discussed henceforth with regard to FIG. 5), which may protect at least a portion of the surface of the semiconductor device 200 from a removal of material from the substrate (e.g., the recesses 404).

The passivation radicals 302 can further include, for example, silicon tetrafluoride ($SiF_4$), silicon tetrachloride ($SiCl_4$), octafluorocyclobutane ($C_4F_8$), and the like. Such passivation radical 302 constituent gasses, and combinations thereof can also include an oxygen component in combination therewith. The passivation radicals 302 can form a protective inhibitor layer 304 over the surface of the semiconductor device 200. The polymer species or a disposition thereof can be modulated according to a temperature, pressure, or the like such that the polymer deposits can be selectively deposited over various portions of the semiconductor device 200, as is further described with regard to, for example, FIG. 8 and FIG. 9. Further, a relative flow rate of the passivation radicals 302 can be varied to control a profile of a recess, such as a relative flow rate between oxygen and other constituent gasses described above, as is further described with regard to FIG. 11.

Figure 4:
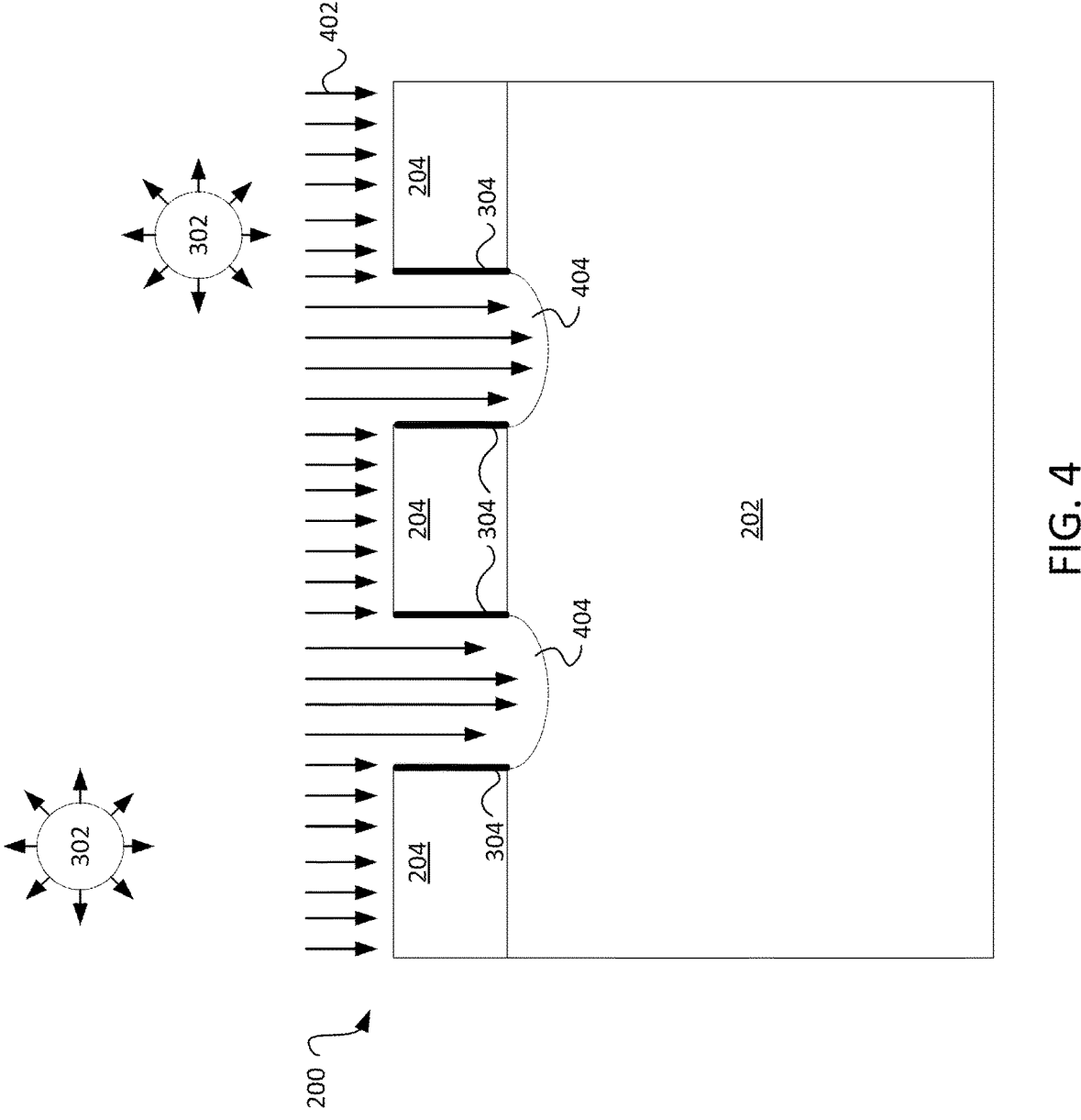

Corresponding to operation 106 of FIG. 1, FIG. 4 is a cross-sectional view of the semiconductor device 200 in which the initial portion of the recesses 404 are exposed, in accordance with various embodiments.

At operation 106, an etchant removes the inhibitor layer 304 from an upper surface for a recess 404 (e.g., an initial portion thereof). For example, an anisotropic etchant can remove the inhibitor layer 304 from horizontal surfaces of the semiconductor device 200. In some embodiments, a bias is applied to accelerate ions 402 in the etching gas plasma toward the substrate 202. The vertical trajectory of the ions 402 causes horizontal surfaces to etch much faster than vertical surfaces. The ions 402 can eject (e.g., sputter) the inhibitor layer 304 surface. The ions 402 can break through the inhibitor layer 304 to expose an upper surface for a recess 404. The ions 402 can further eject a portion of the substrate 202. In some embodiments, a removal rate for the substrate 202 due to ion ejection (sputtering) may be substantially less that a removal rate of the substrate 202 at operation 108, described henceforth. For example, the removal of the substrate 202 via ion ejection at operation 106 may be at least one order of magnitude less than the removal of the substrate 202 via chemical reaction at operation 108. Thus, the ions 402 can act substantially to remove the inhibitor layer 304 and the reactant etchant radical 502 can act substantially to extend the recess 404. For example, the method 100 can include cyclically or continuously applying ions 402 and a chemical etchant to the recess 404 to vertically etch the recess 404.

The initial portion of the recess 404 may be recessed, relative to a portion of the substrate 202 covered by the patterned layer 204 due to the ion ejection or prior interactions with the reactant etchant radical 502 of operation 108 described henceforth. Indeed, each of operations 104, 106, and 108 may be repeated. For example, operations 104, 106, and 108 may be repeated sequentially as a cyclic method 100. In some embodiments, at least a portion of operations 104, 106, and 108 can overlap. For example, each of operations 104, 106, and 108 can be performed simultaneously, whereupon operation 104 can be repeated to reinforce an inhibitor layer 304 in an absence or reduction of a chemical etchant, whereupon the simultaneous and non-simultaneous operations can be cycled therebetween, as is further discussed with regard to operation 108.

The inhibitor layer 304 formed over the patterned layer 204 may be removed therefrom at operation 106. However, the presence of the inhibitor layer 304 may protect a portion of the patterned layer 204 such that the patterned layer 204 may maintain a thickness or a verticality of a sidewall relative to embodiments which do not employ an inhibitor layer 304, or employ such an inhibitor layer 304 during a subsequent operation. For example, as the upper portion of the patterned layer 204 begins to round, an isotopically formed inhibitor layer 304 may be thicker along a vertical dimension which may protect the patterned layer 204 to maintain a substantially vertical sidewall.

Figure 5:
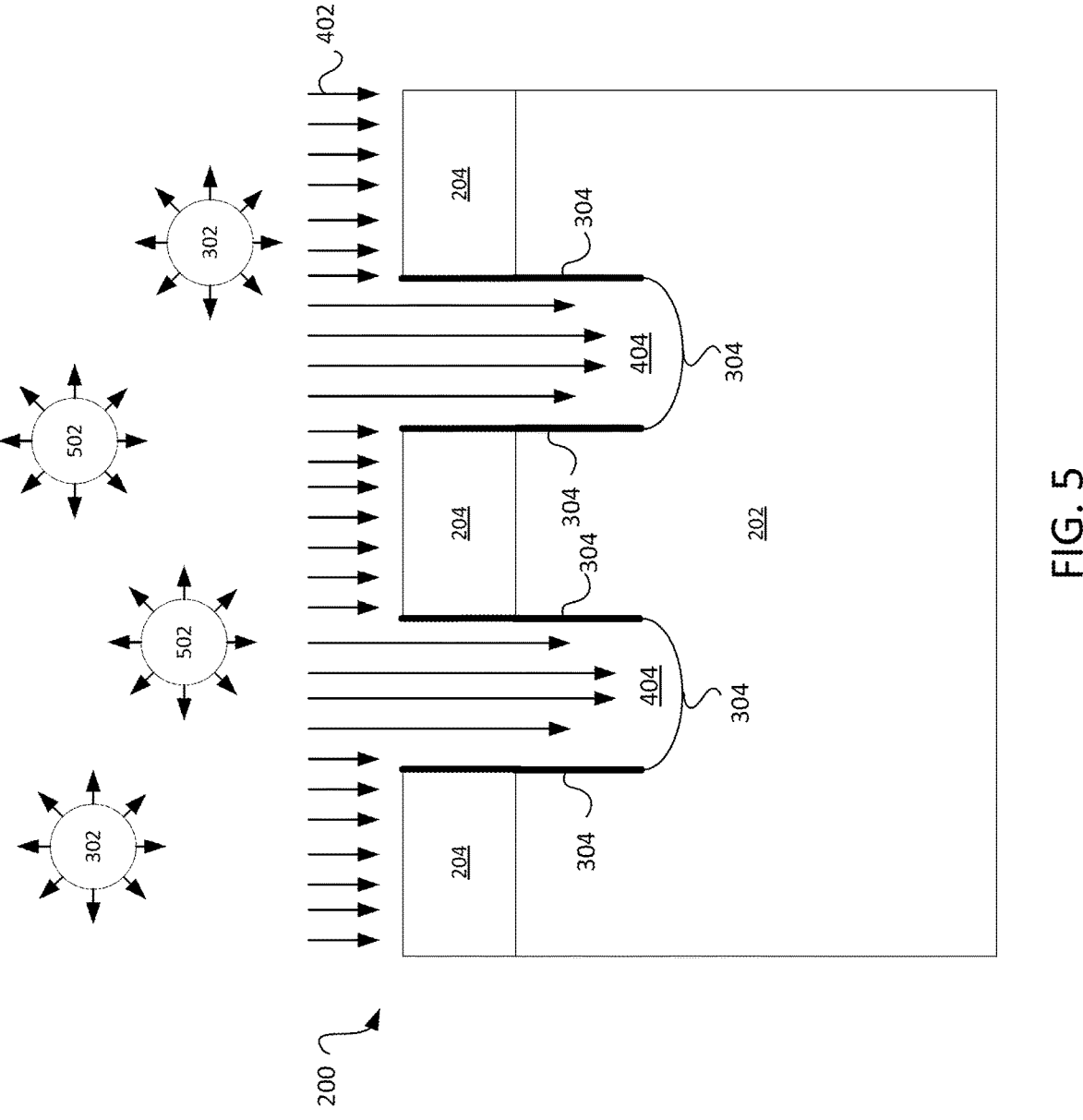

Corresponding to operation 108 of FIG. 1, FIG. 5 is a cross-sectional view of the semiconductor device 200 in which a number of vertical recesses 404 are formed to extend into the substrate 202, in accordance with various embodiments.

A reactant etchant radical 502 can etch an exposed surface of the substrate 202. The reactant etchant radical 502 may be electrically neutral such that the reactant etchant radical 502 may not accelerate in the presence of electric fields (e.g., wherein the passivation is proximal to ions 402 in an inductively coupled plasma, transformer coupled plasma, or the like). For example, the reactant etchant radical 502 can be or include silicon tetrafluoride ($SF_6$). The reactant etchant radical 502 may have anisotropic characteristics, wherein the reactant etchant radical 502 can form volatile products with the (e.g., silicon) substrate 202 along an exposed surface thereof. Such volatile products can thereafter be removed or filtered from a process chamber. The reactant etchant radical 502 can etch undercut portions of a recess 404 or along substantially vertical sidewall of the recess 404 at a same or similar thickness than along horizontal portions of the semiconductor device, in the absence of the inhibitor layer 304. Thus, a reactant material (e.g., the reactant etchant radical 502) may be referred to as an isotropic reactant according to some embodiments of the present disclosure.

Wherein the reactant etchant radical 502 includes isotropic properties, the etching rate and direction can vary according to a presence, thickness, or coverage of the inhibitor layer 304. For example, the recess 404 boundaries such as a sidewall and a bottom surface thereof may etch at different rates according to the presence, absence, or thickness of the inhibitor layer 304.

As depicted, the exposure of the substrate 202 at operation 106 can enable the reactant etchant radical 502 to form volatile byproducts along a bottom surface of the recess 404, and may reduce or prevent interactions between the reactant etchant radical 502 and the sidewalls of the recess 404. Consequently, the extension of the recess 404 may be substantially anisotropic even where the reactant etchant radical 502 has substantially anisotropic characteristics.

As depicted in FIG. 5, the reactant etchant radical 502, passivation radical 302, and ions 402 can simultaneously interface with the semiconductor device 200 during one or more cycles of the method 100. For example, the method 100 can include maintaining a field to accelerate the ions 402 towards the surface of the substrate 202 while forming an inhibitor layer 304 along the surface of the semiconductor device 200. The combination of the anisotropic formation of the inhibitor layer 304 with the isotropic removal of that inhibitor layer 304 can cause the lower portion of the recess 404 to be exposed to the reactant etchant radical 502 while protecting the sidewalls therefrom. By inclusion of an reactant etchant radical 502 along with the passivation radical 302, the reactant etchant radical 502 can interact with the lower surface of the recess 404 to from volatile byproducts which are then expelled from the substrate 202 into a gas phase there-over and may reduce sidewall etching along the recess 404. That is, performing operations 106 and 108 cyclically may cause scalloping along the recess 404 sidewall. The decreasing cycle time can decrease a horizontal extension of the anisotropic etch (e.g., etching 1 μm vertically may correspond to a vertical etch of 1 μm horizontally, etching 0.1 μm vertically may correspond to a vertical etch of 0.1 μm horizontally, and so forth). Performing operations 106 and 108 concurrently, may reduce or avoid scalloping (e.g., as the cycle time approaches zero, as in a continual process, the horizontal etching can also approach zero).

However, such a process may be difficult to control, wherein slight variations in pressure, temperature, flow rates, or the like can affect a profile of the recess 404. Moreover, the upper surface of the sidewall may interact with more ions 402 than a bottom portion, because a portion of the ions 402 may be traveling somewhat laterally as well as vertically. Such effects can cause a removal of an inhibitor layer 304 at an upper portion of the sidewall, such that the reactant etchant radical 502 can interact with the substrate 202 to cause surface roughening or other isotropic features in the recess 404 sidewall. Thus, the method 100 can proceed to operation 110 as is described henceforth, which may reinforce the inhibitor layer 304 to avoid or mitigate sidewall surface roughness.

The method 100 can include a low frequency bias power engagement at operation 108, which may anisotropic remove the inhibitor layer 304, and may be disengaged hereinafter, to accumulate the inhibitor layer 304 over various surfaces, or engaged hereinafter to selectively removed portion of the inhibitor layer 304 along the bottom of the recess 404 while reducing removal over the sidewall. Put differently, the accumulation of the inhibitor layer 304 in an absence of reactant etchant radicals 502 may avoid surface roughening of the upper sidewall. Reducing low frequency bias power may reduce a number of ions 402 energetically striking the inhibitor layer 304 along the upper sidewall portion to so as to remove the inhibitor layer 304 such that the inhibitor layer 304 can accumulate. Various source power can be employed. For example, the power can include inductively coupled plasmas, microwave plasmas, radio frequencies, or the like. The frequency of an upper electrode may exceed 40 MHZ. Magnetic pressure can vary. For example, pressures of between about 10 mT and 1000 mT may be employed in various embodiments.

Figure 6:
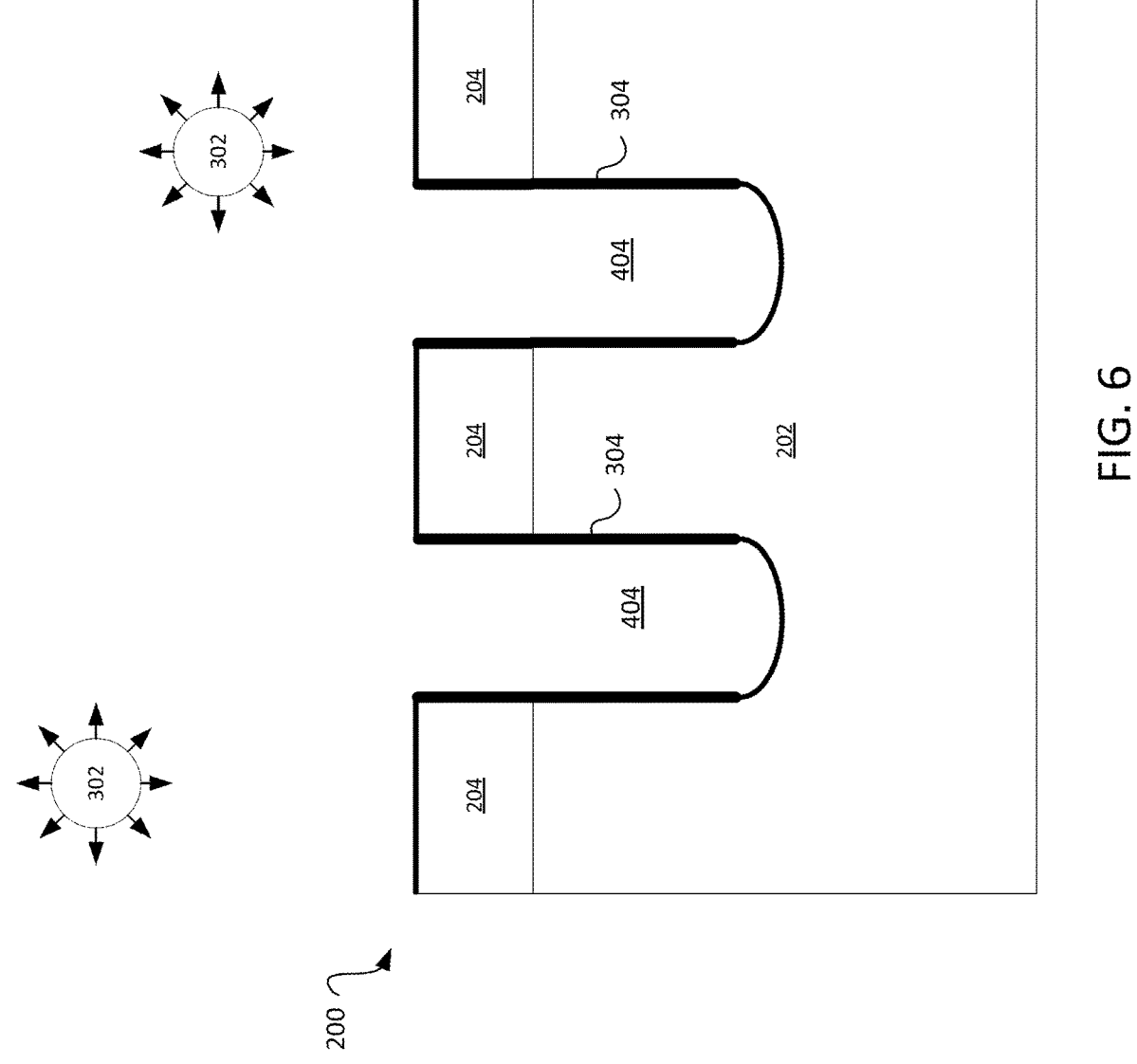

Corresponding to operation 110 of FIG. 1, FIG. 6 is a cross-sectional view of the semiconductor device 200 in which the inhibitor layer 304 is reinforced over a surface of the semiconductor device 200, in accordance with various embodiments.

As depicted, the passivation radical 302 forms an inhibitor layer 304 over the surface of the semiconductor device 200. The inhibitor layer 304 can be somewhat thicker over portions which included an inhibitor layer 304 during the etching described with regard to operation 108. Thus, the inhibitor layer 304 sidewall dimension may be greater than the inhibitor layer 304 bottom recess dimension. Such a difference in thickness can be based on an accumulation of an inhibitor over an existing inhibitor layer 304.

Further, rough edges, bowed edges, or other non-vertical features of the sidewall may include greater surface areas than smooth vertical portions of the semiconductor device 200. The greater surface area can, in turn benefit from a greater accumulation of the inhibitor layer 304 there-over. Such an accumulation can protect upper surfaces of the sidewalls. Put differently, the surface roughness may interact with additional passivation radical 302 (e.g., proportional to a surface area thereof), such that any rough areas can receive additional protection. Accordingly, a sequence of the operations of the method 100 may create negative feedback in the development of non-vertical surfaces, wherein the additional inhibitor layer 304 thickness tends to limit further roughening, bowing, etc.

As described above, ions 402 may be accelerated towards the surface of the semiconductor device at operation 110 (e.g., at a same or reduced energy level or DC bias), or may be omitted.

With further correspondence to operation 108 of FIG. 1, FIGS. 7, 8, and 9 depict cross-sectional views of the semiconductor device 200 in which a number of vertical recesses 404 are formed to extend further into the substrate 202, in accordance with various embodiments.

Figure 7:
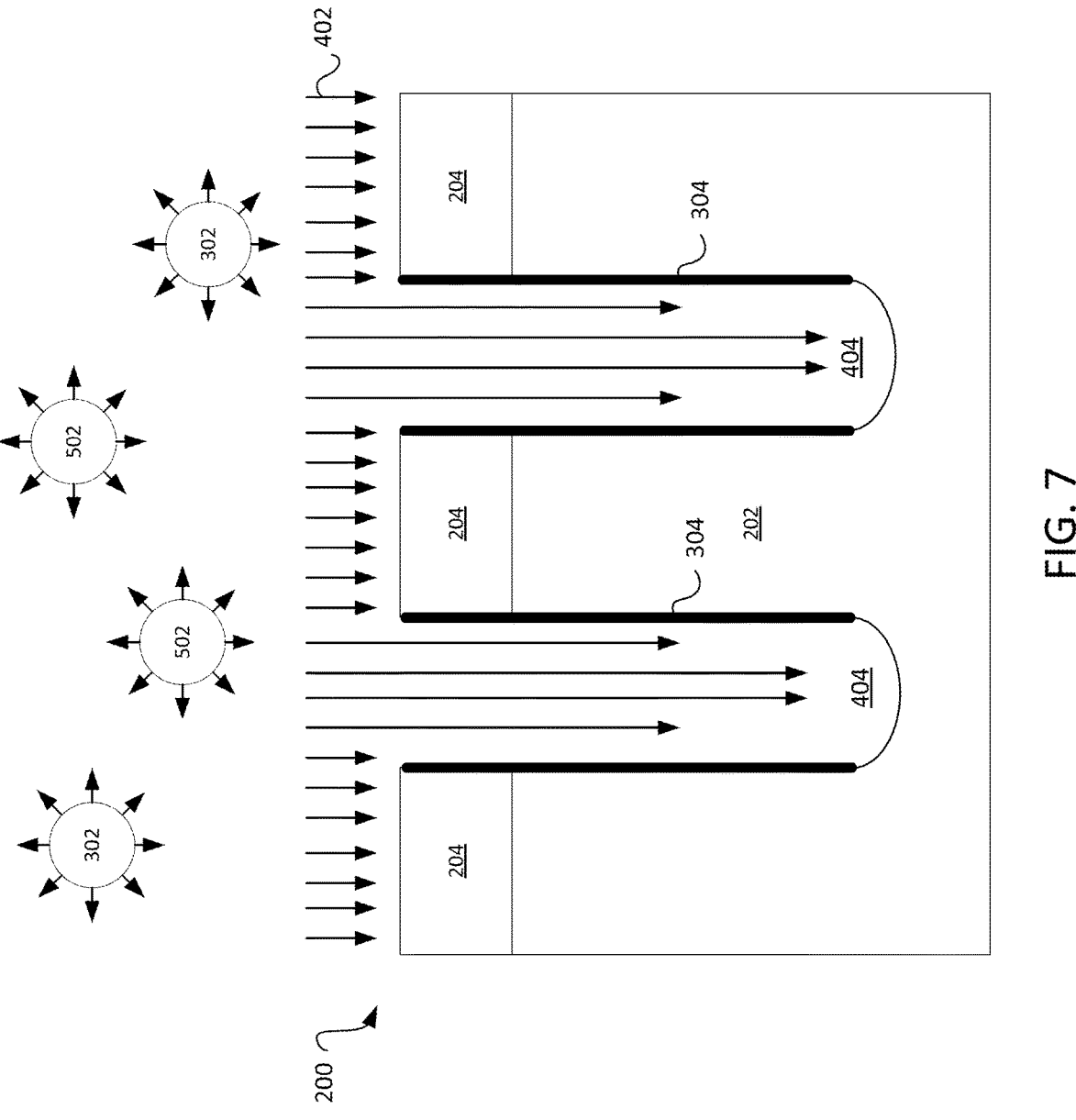
Figure 8:
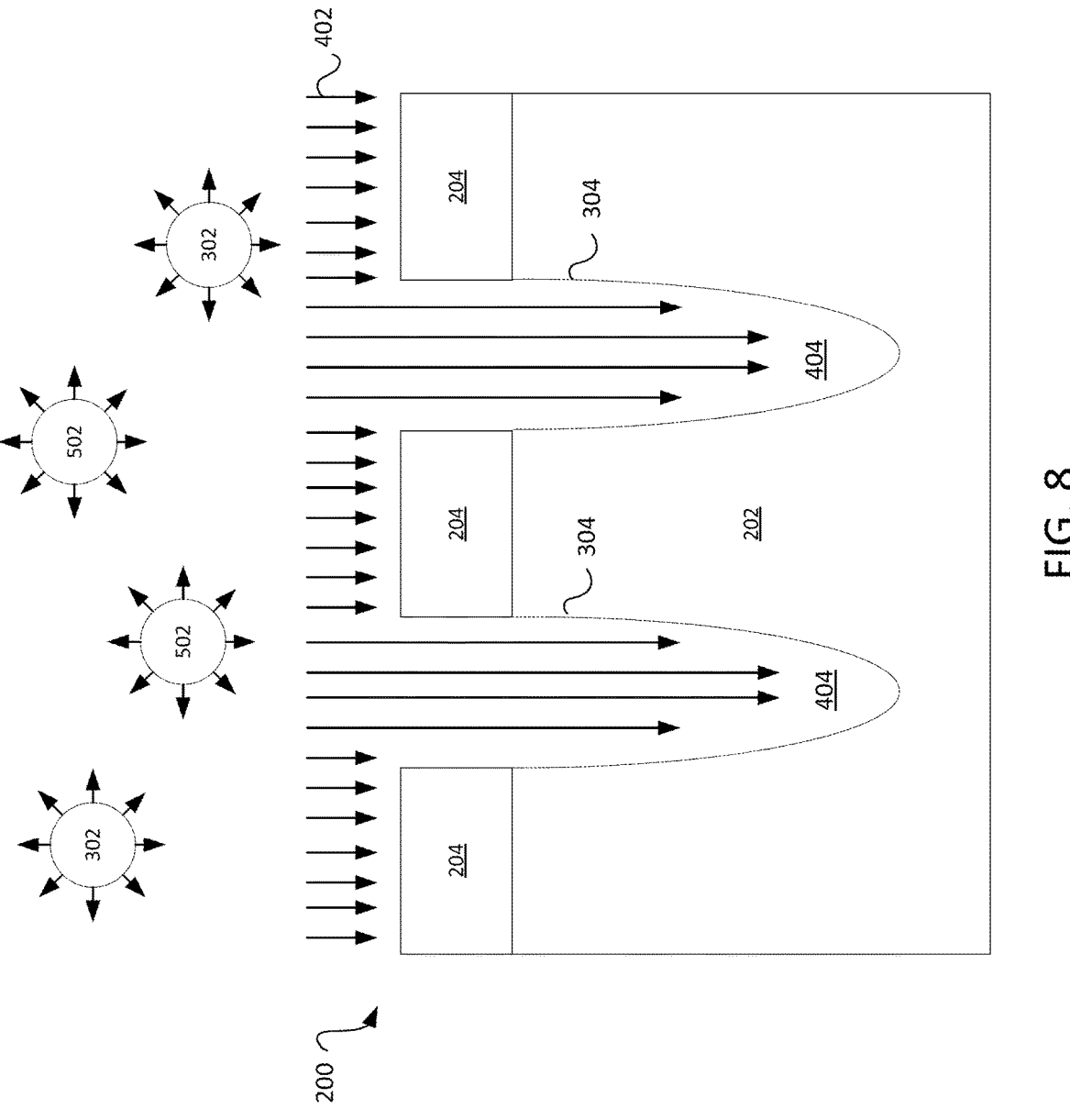
Figure 9:
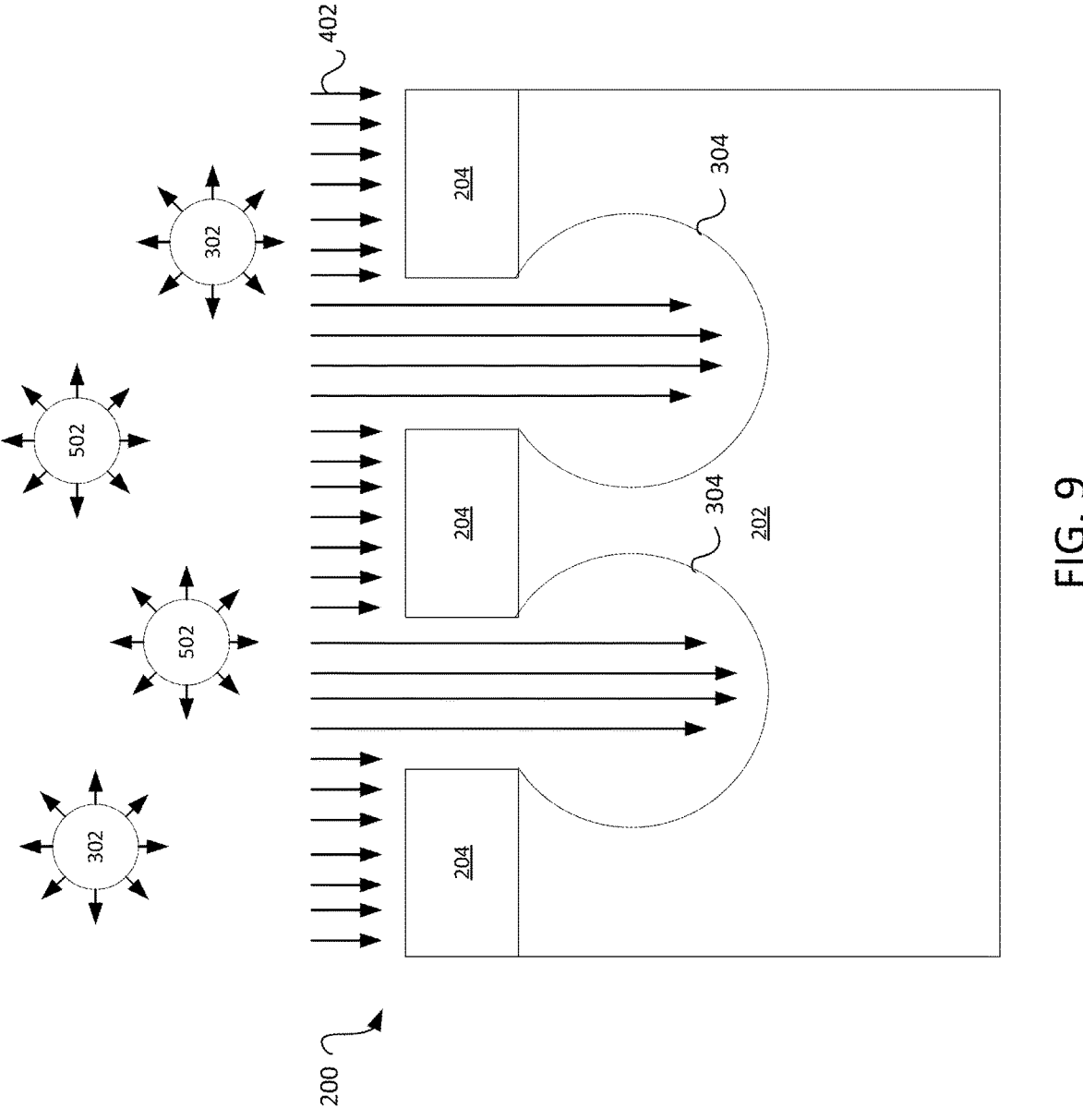

As depicted in FIG. 7, the recesses 404 extends substantially vertically into the substrate 202. According to the process described herein, the vertical extension can correspond to a ratio of the passivation radical 302 to the reactant etchant radical 502. That is, over passivated sidewalls may exhibit taper, as depicted in FIG. 8, wherein under passivated sidewalls may exhibit undercuts, as depicted in FIG. 9. By cycling between etching and reinforcing operations, process control may be aided, such that the substantially recess 404 sidewalls of FIG. 7 (or another desired etch) can be maintained with less process control than a continuous process, and less scalloping or other sidewall etching than a cyclic process which does not employ a passivation radical 302 during an etching operation.

Figure 10:
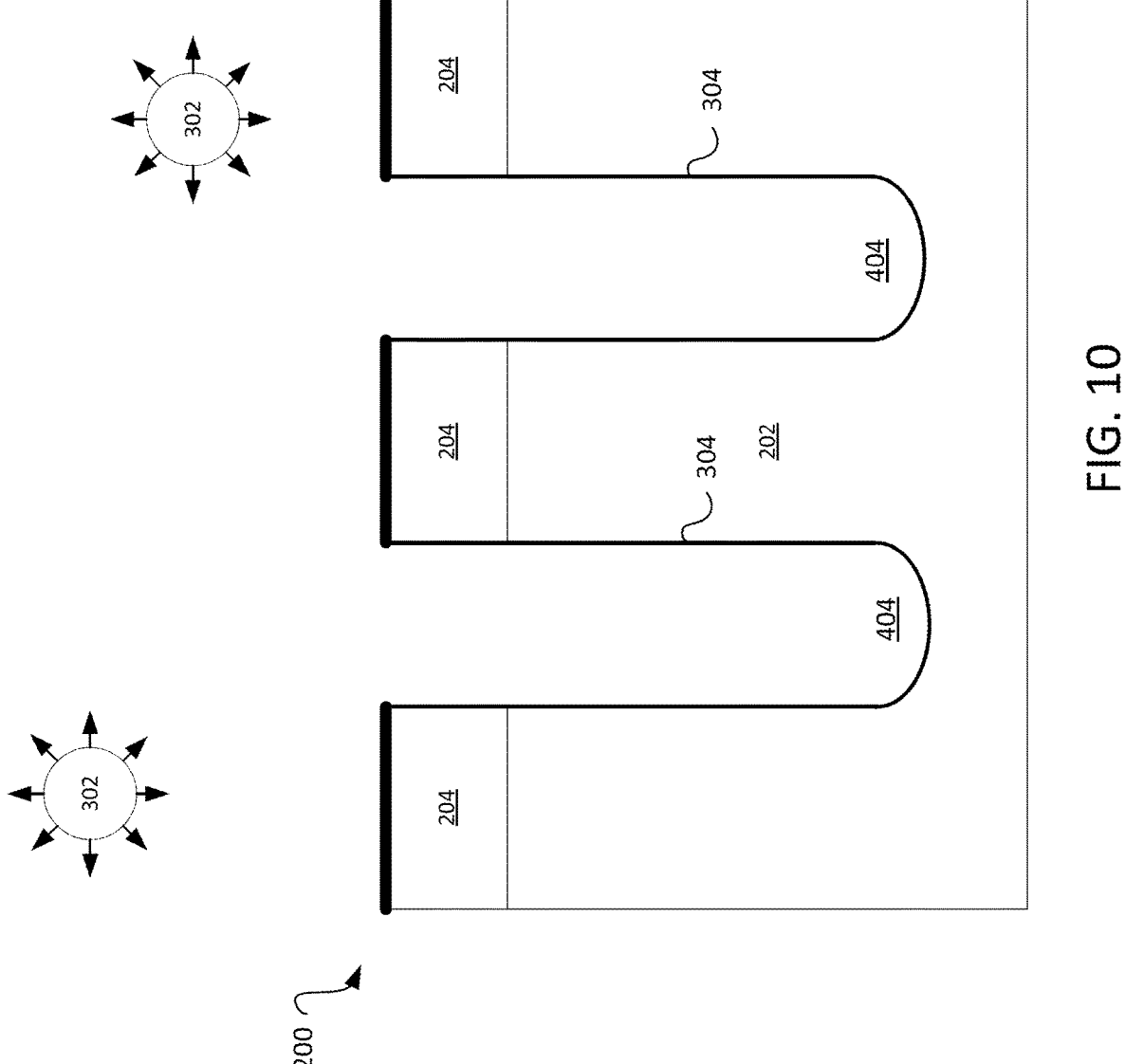

Similar recess 404 profiles may result from varied process conditions. For example, the passivation radical 302 can be provided over the substrate 202 at various conditions, to generate more dissociated species from the passivation radicals 302 (e.g., the SiF$_4$) which can exhibit "sticky" characteristics. Such process parameters can be varied to protect various portions of the semiconductor device 200. Referring now to FIG. 10, highly dissociated species are depicted with a thickness of an inhibitor layer 304 formed over the vertical sidewalls substantially less than the thickness of the inhibitor layer 304 formed over the horizontal surfaces of the semiconductor device 200 (e.g., over the patterned layer 204). A power increase or a pressure decrease can cause the inhibitor layer 304 to form at a greater thickness over the patterned layer 204 (e.g., mask, to protect the mask), relative to the sidewalls. Conversely, a power can be decreased or a pressure can be increased to cause the inhibitor layer 304 to form at a similar thickness over a patterned layer 204 and a recess 404 sidewall. More particularly, pressures less than about 50 mT can be selected for certain dissociated species which may result in a relatively anisotropic formation of the inhibitor layer 304 (as depicted in FIG. 10) and pressures greater than about 250 mT can be selected for certain dissociated species which may result in a relatively isotropic formation of the inhibitor layer 304 (as depicted in FIG. 3). Like magnetic pressure and temperature level, a temperature for a process can vary to adjust a level of dissociation of the SiF$_6$. More particularly, an inhibitor film thickness can be thicker at lower temperatures (e.g., temperatures between about 0° C. and −100° C.) and thinner at higher temperatures, (e.g., ambient temperatures, such as about 20° C.). Such low temperature films can be Flourine rich. Higher oxygen levels may thin the inhibitor layer 304 which may improve etch resistance. The various film properties may be adjusted to control a critical dimension of the recesses 404 as is further described with regard to FIG. 11.

Figure 11:
FIG. 11 illustrates a dimensional relationship diagram corresponding to critical dimensions of a recess and a ratio of an oxidizer to another passivation radical, in accordance with some embodiments.

Referring now to FIG. 11, a dimensional relationship diagram 1100 is depicted. The dimensional relationship diagram 1100 includes a ratio axis 1102 corresponding to a ratio between oxygen and silicon tetrafluoride (SiF$_4$). A ratio or quantity of oxygen may be modulated to control a rate of various interactions. For example, the O$_2$ can interface with (e.g., oxidize) the patterned layer 204 and so degrade the patterned layer 204. Thus, it may be desirable to adjust an oxygen flow rate. However, a passivation of the recess 404 sidewall may be desirable. Thus a substitution of SiF$_4$ or other passivation radicals 302 for O$_2$ may be desirable. However, a substitution rate may vary according to a desired critical dimension such as an upper or lower width of a recess 404 or a depth of the recess 404.

A depth axis 1104 can depict a depth of a recess 404 corresponding to the various flow rates of the ratio axis 1102. As depicted, the correlation between the various ratios and the depth may be uncorrelated or weakly correlated. For example, the depicted depth correlation 1108 can be substantially linear (e.g., slightly negatively correlated) such that the depicted range of SiF$_4$:O$_2$ ratios cause negligible or no changes to recess 404 depth within the depicted range (e.g., up to 3 or 4 standard cubic centimeters per minute (SCCM) SiF$_4$ for each SCCM of O$_2$).

A critical dimension (CD) of the top of the recess 404, which may be referred to as an upper CD 1110 may include a lateral dimension thereof, shown corresponding to an width axis 1106 (e.g., a horizontal dimension of the recess 404 as depicted in FIG. 2 through FIG. 10). Such a dimension may be weakly correlated or non-correlated with the SiF$_4$:O$_2$ ratio. The SiF$_4$:O$_2$ ratio can vary from about 2:1 to about 4:1 standard cubic centimeters per minute (SCCM), though the depicted ratio axis 1102 is of arbitrary scale and can vary (e.g., from about 1:1 to about 1:2, or other values according to various substrate 202 materials or other process parameters). The CD of the lower surface of the recess 404, which may be referred to as a lower CD 1112 can include a same lateral dimension as the upper CD 1110. The lower CD 1112 may be stronger correlated with the critical dimension than the upper CD 1110. Thus, a ratio of SiF$_4$:O$_2$ can be modulated such that the dimension of the lower CD 1112 is adjusted. For example, responsive to sidewall taper (as depicted in FIG. 8), a ratio of SiF$_4$:O$_2$ can be increased; responsive to undercut or other isotropic features, (as depicted in FIG. 9) a ratio of SiF$_4$:O$_2$ can be decreased. Further, as depicted, the upper CD 1110 can correlate opposite than the lower CD 1112, which may further cause sidewall verticality normalization from the adjustments to the ratio, because an increase in dimension of the lower CD 1112 can correspond to decrease of dimension of the upper CD 1110.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for etching a substrate to form a recess in the substrate, the method comprising:
  forming an inhibitor layer lining an initial portion of the recess based on first radicals;
  exposing the initial portion of the recess based on ions subsequent to forming the inhibitor layer and prior to introducing second radicals;
  extending the initial portion of the recess with a mixture comprising the first radicals and the second radicals; and
  repeating the forming, exposing, and extending steps.

2. The method of claim 1, wherein the second radicals include sulfur hexafluoride ($SF_6$), and the first radicals include a combination of silicon tetrafluoride ($SiF_4$) and oxygen ($O_2$).

3. The method of claim 1, wherein the second radicals include sulfur hexafluoride ($SF_6$), and the second radicals include a combination of silicon tetrachloride ($SiCl_4$) and oxygen ($O_2$).

4. The method of claim 1, wherein the second radicals include sulfur hexafluoride ($SF_6$), and the first radicals include octafluorocyclobutane ($C_4F_8$).

5. The method of claim 1, wherein the first radicals and the second radicals each have an isotropic characteristic, and the exposing step has an anisotropic characteristic.

6. The method of claim 1, wherein the exposing step comprises removing a first portion of the inhibitor layer that overlays a bottom surface of the initial portion of the recess.

7. The method of claim 6, wherein, during the exposing step, a second portion of the inhibitor layer extends along inner sidewalls of the initial portion of the recess substantially intact.

8. The method of claim 1, wherein the recess extends through the substrate, and the method further comprises filling the recess with a conductive material.

9. The method of claim 1, further comprising:
  detecting a profile or surface roughness of the recess for the substrate; and
  adjusting, based on the detection, a ratio of the first radicals and the second radicals for the extending step for the substrate or for a second substrate.

10. A method, comprising:
  forming a patterned layer over a first portion of a substrate, with a second portion of the substrate exposed;
  forming an inhibitor layer along inner surfaces of a recess with first radicals;
  etching the substrate along the second portion with second radicals to form the recess;
  breaking through the inhibitor layer along the second portion with ions subsequent to forming the inhibitor layer and prior to introducing the second radicals for the etching;
  extending the recess with a mixture comprising the first radicals and the second radicals; and
  repeating the step of etching the substrate, the step of forming the inhibitor layer, the step of breaking through the inhibitor layer, and the step of extending the recess in such an order more than once.

11. The method of claim 10, wherein the step of etching the substrate and the step of forming the inhibitor layer are performed concurrently.

12. The method of claim 11, wherein the second radicals include sulfur hexafluoride ($SF_6$), and the first radicals include a combination of silicon tetrafluoride ($SiF_4$) and oxygen ($O_2$).

13. The method of claim 12, wherein a ratio of the $SiF_4$ to the $O_2$ is greater than 2.

14. The method of claim 11, wherein the second radicals include sulfur hexafluoride ($SF_6$), and the first radicals include a combination of silicon tetrachloride ($SiCl_4$) and oxygen ($O_2$).

15. The method of claim 11, wherein the second radicals include sulfur hexafluoride ($SF_6$), and the first radicals include octafluorocyclobutane ($C_4F_8$).

16. The method of claim 10, further comprising:
  detecting a profile or surface roughness of the recess for the substrate; and
  adjusting, based on the detection, a ratio of the first radicals to the second radicals for the extending step for the substrate or for a second substrate.

17. A method, comprising:
  (i) etching a semiconductor layer with a first isotropic reactant to form a recess therein;
  (ii) providing the first isotropic reactant to form an inhibitor layer lining inner surfaces of the recess;
  (iii) removing a portion of the inhibitor layer with an anisotropic reactant subsequent to forming the inhibitor layer and prior to introducing a second isotropic reactant;
  (iv) providing the second isotropic reactant to extend the recess simultaneously to the provision of the first isotropic reactant; and
  repeating at least steps (ii), (iii), and (iv) to further extend the recess.

18. The method of claim 17, wherein the second isotropic reactant includes sulfur hexafluoride ($SF_6$), and the first isotropic reactant include a combination of silicon tetrafluoride ($SiF_4$) and oxygen ($O_2$).

19. The method of claim 17, wherein the second isotropic reactant includes sulfur hexafluoride ($SF_6$), and the first isotropic reactant include a combination of silicon tetrachloride ($SiCl_4$) and oxygen ($O_2$).

20. The method of claim 17, wherein the second isotropic reactant includes sulfur hexafluoride ($SF_6$), and the first isotropic reactant include octafluorocyclobutane ($C_4F_8$).

* * * * *